United States Patent
Kitabayashi

(10) Patent No.: US 7,200,831 B2
(45) Date of Patent: Apr. 3, 2007

(54) SEMICONDUCTOR INTEGRATED CIRCUIT WIRING DESIGN METHOD AND SEMICONDUCTOR INTEGRATED CIRCUIT

(75) Inventor: Shinji Kitabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 10/972,463

(22) Filed: Oct. 26, 2004

(65) Prior Publication Data

US 2005/0110130 A1   May 26, 2005

(30) Foreign Application Priority Data

Oct. 28, 2003   (JP)   ............... 2003-367374

(51) Int. Cl.
  *G06F 17/50*   (2006.01)
  *G06F 19/00*   (2006.01)
  *H01L 21/82*   (2006.01)

(52) U.S. Cl. ................ 716/13; 716/14; 716/10; 716/9; 700/121; 700/98; 700/118; 438/129; 438/130

(58) Field of Classification Search .......... 716/13, 716/14, 9, 10; 700/98, 118, 121; 438/129, 438/130

See application file for complete search history.

(56) References Cited

U.S. PATENT DOCUMENTS

| 5,798,937 | A  | * | 8/1998  | Bracha et al. | ........... | 716/9 |
| 7,007,258 | B2 | * | 2/2006  | Li            | ........... | 716/9 |
| 2004/0255258 | A1 | * | 12/2004 | Li         | ........... | 716/8 |

FOREIGN PATENT DOCUMENTS

JP        11-312738        11/1999

* cited by examiner

*Primary Examiner*—Phallaka Kik
(74) *Attorney, Agent, or Firm*—Oblon, Spivak, McClelland, Maier & Neustadt, P.C.

(57) ABSTRACT

The facility of operation in a manufacturing process and the reliability of the finished product can be improved by making a design based on two basic wiring pattern layers in which wiring traces are formed with regularity, and a basic via array layer inserted between the two basic wiring pattern layers, in which vias are formed with regularity

15 Claims, 8 Drawing Sheets

SEMICONDUCTOR INTEGRATED CIRCUIT WIRING DESIGN METHOD AND SEMICONDUCTOR INTEGRATED CIRCUIT

CROSS-REFERENCE TO RELATED APPLICATION

This application is based upon and claims the benefit of priority from prior Japanese Patent Application No. 2003-367374, filed on Oct. 28, 2003, the entire contents of which are incorporated herein by reference.

BACKGROUND OF THE INVENTION

1. Field of the Invention

The present invention relates to a semiconductor integrated circuit wiring design method, and a semiconductor integrated circuit.

2. Background Art

Recently, in the field of the semiconductor integrated circuit wiring design, it has been a common practice to create redundancy in the layout patterns after the designing of wiring is completed in order to secure a certain level of wiring density, taking into consideration the controllability of processing accuracy in the manufacture process, as described in, e.g., Japanese Patent Laid-Open Publication No. 312738/1999.

FIGS. 18–20 are layout patterns for explaining an example of such a conventional semiconductor integrated circuit wiring method.

FIG. 19 shows a layout pattern of an upper layer (first metal layer), and FIG. 20 shows a layout pattern of a lower layer (second metal layer). That is to say, the wiring layer includes the two layers, i.e., the upper and the lower layers, and the wiring traces 1a, 1a, . . . formed on the upper layer as shown in FIG. 19 are connected to the wiring traces 2a, 2a, . . . formed on the lower layer as shown in FIG. 20 through vias (not shown), thereby forming the wiring pattern shown in FIG. 18, i.e., completing the wiring of the device. In FIG. 19, the wiring traces 1a, 1a . . . , which serve as preferential wiring traces, extend in the horizontal direction in the drawing. In FIG. 20, the wiring traces 2a, 2a . . . , which serve as preferential wiring traces, extend in the vertical direction in the drawing. In FIGS. 19 and 20, the traces other than the wiring traces are redundant traces 1b, 1b, . . . , 2b, 2b . . . .

That is to say, as shown in these drawings, the wiring in the semiconductor integrated circuit is formed by using the stacked layers, i.e., the first metal layer 1 and the second metal layer 2.

As described above, the conventional semiconductor integrated circuit wiring method includes determining, in each wiring layer, a direction in which preferential traces extend, setting a wiring grid so that the wiring can be formed in accordance with a predetermined design standard, and forming desired wiring traces in a free space, based on the aforementioned conditions and standard. However, as the miniaturization process has advanced, a problem of process accuracy has arisen. Since it has become difficult to form only the layout pattern that is necessary to form the signal wiring (including the wiring traces 1a and 2a), an increase in density of layout traces in the upper and the lower wiring layers is required. For this purpose, conventionally, redundant traces 1b and 2b are formed in the free space that is not occupied by the wiring traces 1a and 2a to adjust the trace density. That is to say, redundancy is made after the wiring design is finished. This method has various problems. For example, conventionally, the redundant traces 1b and 2b are formed at the time of the generation of mask data after the wiring design is completed in order to improve the metal coverage rate in each wiring layer and to increase the density in traces. This may cause a problem, however, in that because the positions to put redundant traces are decided after the wiring design is completed, there is a possibility that short-circuit verification for redundant traces is omitted. Furthermore, since the redundant traces are put at random in the area to which no wiring traces are provided, there is a possibility that the actual processing steps are difficult. Under such circumstances, there is a demand that the redundant layout traces formed to increase the pattern density in each wiring layer have regularity and uniformity.

Besides the metal layers (wiring patterns), via layers (serving as relay wiring layers) for connecting the metal wiring lines are also requested to increase the pattern density in view of the improvement in controllability of processing accuracy. That is to say, in the field of semiconductor integrated circuits, which will be more and more miniaturized, there is a strong demand for a wiring method that can improve the processing accuracy and controllability.

As described above, conventionally, redundant traces are formed at the time of the generation of mask data after the formation of wiring pattern. Because of this, the verification of redundant traces cannot be sufficiently performed. Furthermore, since the redundant traces are formed later, it is difficult for the redundant traces to have satisfactory regularity, which may cause a problem of processing accuracy and controllability.

SUMMARY OF THE INVENTION

According to an embodiment of the present invention, with respect to a method of designing wiring of a semiconductor integrated circuit including as a wiring design base:

at least two of basic wiring pattern layers constituting a multilayer structure, each basic wiring pattern layer having a plurality of wiring traces in a strip shape;

a basic via array layer located between the two basic wiring pattern layers, having a plurality of vias relaying and connecting the wiring traces of the two basic wiring pattern layers; and another basic via array layer located at a side of one of the two basic wiring pattern layers, including a plurality of vias connecting predetermined ones of the wiring traces of the one of the two basic wiring pattern layers with circuit elements, the method includes:

preparing the basic wiring pattern layers so as to have the wiring traces extending in a predetermined direction and arranged with regularity to form a repetitive pattern in wiring regions of the basic wiring pattern layers;

preparing the basic via array layer so as to have the vias arranged in an array form with regularity to form a repetitive pattern in a wiring region of the basic via array layer;

forming processed wiring pattern layers having been subjected to design processing from the basic wiring pattern layers by selecting predetermined wiring traces, and cutting the selected wiring traces at some intermediate portions to form a plurality of wiring trace pieces in consideration of the need for wiring traces serving as signal wiring traces, and the need for wiring traces serving as dummy wiring traces;

forming a processed via array layer having been subjected to design processing from the basic via array layer by eliminating unnecessary vias, with the vias serving as connections vias and dummy vias being left in consideration of the need for connection vias and dummy vias; and forming desired wiring lines by relaying and connecting the wiring traces and the wiring trace pieces of the two processed wiring pattern layers with the remaining connection vias in the processed via array layer, and leaving the wiring traces, the wiring trace pieces, and the dummy vias not related to the wiring lines to form a dummy pattern.

Furthermore, according to other embodiment of the present invention, with respect to a method of designing wiring of a semiconductor integrated circuit, comprising:

preparing as a base of wiring design at least two basic wiring pattern layers each including a plurality of wiring traces in a strip shape and a basic via array layer including a plurality of vias and being sandwiched between the basic wiring pattern layers;

forming processed wiring pattern layers having been subjected to design processing from the basic wiring pattern layers by cutting a predetermined number of the wiring traces at predetermined intermediate portions to form a plurality of wiring trace pieces from each wiring trace;

forming a processed via array layer having been subjected to design processing from the basic via array layer by eliminating unnecessary vias, the remaining vias serving as connection vias and dummy vias; and forming a plurality of wiring lines by connecting part of the wiring traces and the wiring trace pieces of the one of the two processed wiring pattern layers with that of the other using the connection vias of the processed via array layer, the remaining wiring traces and wiring traces pieces being left as dummy wiring traces and dummy wiring trace pieces.

Furthermore, according to further embodiment of the present invention, a semiconductor integrated circuit includes:

a first and a second wiring pattern layers constituting a multilayer structure; and a via array layer located between the first and the second wiring pattern layers, the first wiring pattern layer including a plurality of first wiring traces each having a strip shape and the second wiring pattern layer including a plurality of second wiring traces each having a strip shape, the first and second wiring traces in the first and the second pattern layers extending in predetermined directions, the first wiring traces intersecting with the second wiring traces in a skewed manner when viewed two-dimensionally, the vias of the via array layers are located at selected intersections so as to connect the first wiring traces with the second wiring traces, in wiring regions of the first and the second wiring pattern layers, the first wiring traces and the second wiring traces are repetitively formed with predetermined intervals, some of the first and the second wiring traces being cut to form a plurality of first wiring trace pieces and second wiring trace pieces, some of the first wiring traces and the first wiring trace pieces being connected with the second wiring traces and the second wiring trace pieces to form signal wiring lines through which a signal passes, the remaining of the first and second wiring traces and the first and second wiring trace pieces serving as dummy wiring lines, and in the via array layers some of the vias connecting the first wiring traces with the second wiring traces, and the other vias serving as dummy vias.

DESCRIPTION OF THE EMBODIMENTS

Hereinafter, an embodiment of the present invention will be described in more detail with reference to the accompanying drawings.

In the present invention, the wiring to be described below is connected to transistors (circuit elements) constituting an actual semiconductor integrated circuit. For example, the lower wiring layer of the stacked upper and lower wiring layers connected through vias is connected to input and output terminals of the transistors (circuit elements), and also connected to the upper wiring layer through vias.

Generally, in a semiconductor integrated circuit, the lowest layer is referred to as "first layer", and upper layers are sequentially referred to as "second layer", "third layer", etc. However, in the present invention, for the sake of the convenience of explanation, the uppermost layer is referred to as "first layer", and lower layers are sequentially referred to as "second layer", "third layer", etc. Accordingly, the "second layer" is the second layer counting from the uppermost layer.

The basic concept of the embodiment of the present invention is as follows. The wiring portion of the semiconductor integrated circuit is formed of a plurality of stacked wiring layers (processed wiring layers). Each processed wiring layer is formed by cutting (disconnecting) and/or removing (eliminating) the wiring traces and vias of a basic wiring layer, on which a basic pattern (wiring traces in strip shapes and vias in pillar shapes) is formed before adopting a design, so that a required density is obtained. That is, the basic wiring layer includes a basic wiring pattern layer, on which a wiring pattern is formed, and a via array layer, on which a via array is formed.

Figure 13:
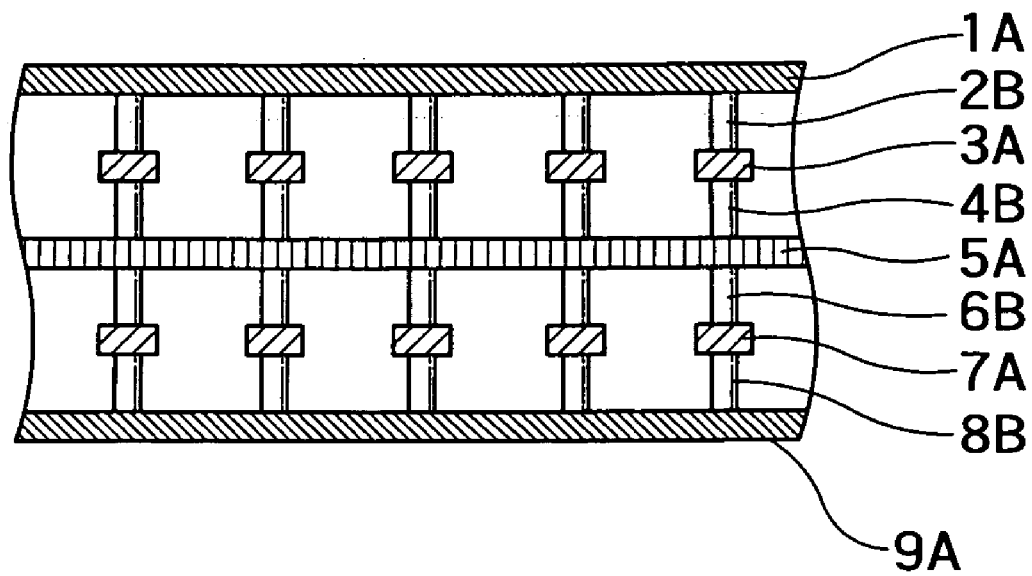
FIG. 13 shows a part of the stacked basic wiring layers shown in FIGS. 1–9.
Figure 14:
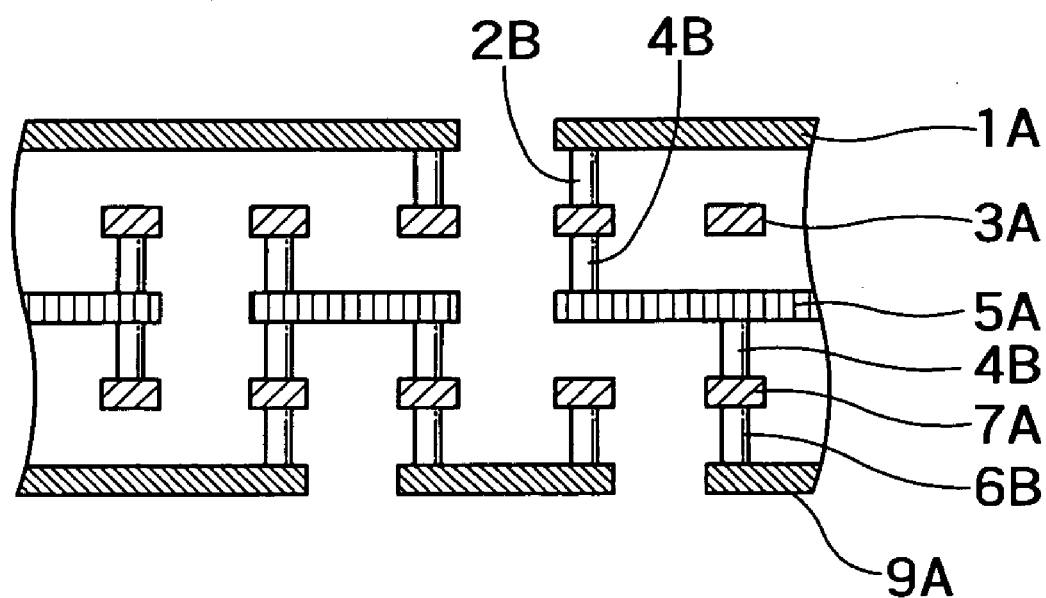
FIG. 14 shows a part of the stacked processed wiring layers including those illustrated in FIGS. 10–12.

The semiconductor device of this embodiment has a multilayer structure including nine processed wiring layers. The basic wiring layers of the nine layers before being subjected to a design processing are shown in FIGS. 1–9. If the nine basic wiring layers were stacked, the section thereof would be as shown in FIG. 13. Of course, such stacked layers do not actually exist. FIG. 13 shows a part of the stacked layers. FIG. 14 shows a part of the stacked processed wiring layers corresponding to those in FIG. 13, each processed layer having been subjected to a design process.

That is to say, FIG. 14 is a partial sectional view of an actual product (semiconductor device). A method of forming the layers shown in FIG. 14 from the conceptual layers shown in FIG. 13 through a design process will be described below.

Figure 1:
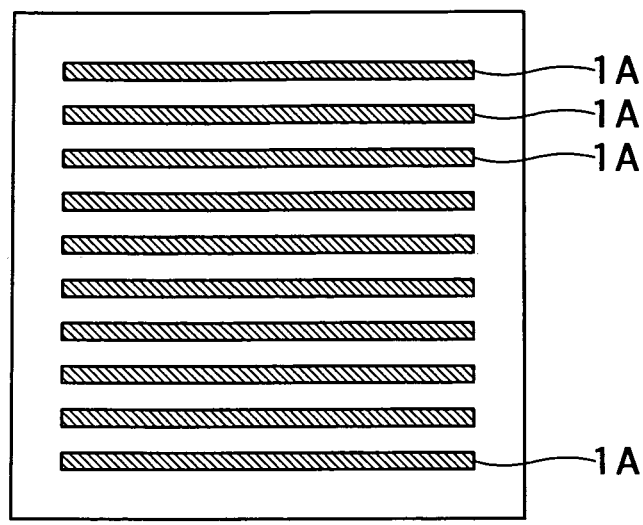
FIG. 1 is a plan view of a basic wiring layer (first layer from the top) of an embodiment of the present invention before being subjected to design processing.

As described above, the wiring portion of the semiconductor device is formed of the nine processed wiring layers, as shown in, e.g., FIG. 14. The basic wiring layers, which are the basis of the processed wiring layers, are shown in FIGS. 13 and 1–9. FIG. 1 shows a basic wiring layer of the first (uppermost) layer counting from the top of the device. FIGS. 2–9 show the second to ninth (lowermost) basic wiring layers. As can be understood from the drawings, wiring traces 1A, 3A, 5A, 7A and 9A, formed of a metal layer and extending in a horizontal or vertical direction in the drawings, are formed in the first, third, fifth, seventh, and ninth basic wiring layers (basic wiring pattern layers). The wiring traces in each layer can be regularly formed based on a design standard. With respect to the first, third, fifth, seventh, and ninth layers, the wiring traces of a layer and those of its upper or lower layer cross each other in an orthogonal manner or an inclined manner, resulting in that when viewed two-dimensionally, the wiring traces constitute a grid. Although the wiring traces cross each other in an orthogonal manner, they may cross in an inclined manner. As a result of the wiring design processing performed at a later stage, the wiring traces will be divided into two groups, i.e., those used to actually pass signals (wiring traces for signals) and those having a potential fixed to a power supply potential or a ground potential and used as dummy wiring traces. For example, it is possible to minimize the adverse affect of the interference and diffraction of light in the manufacture process by regularly aligning the wiring traces 1A of the first layer as shown in FIG. 1 without leaving any space. The same applies to the second and subsequent layers.

Figure 2:
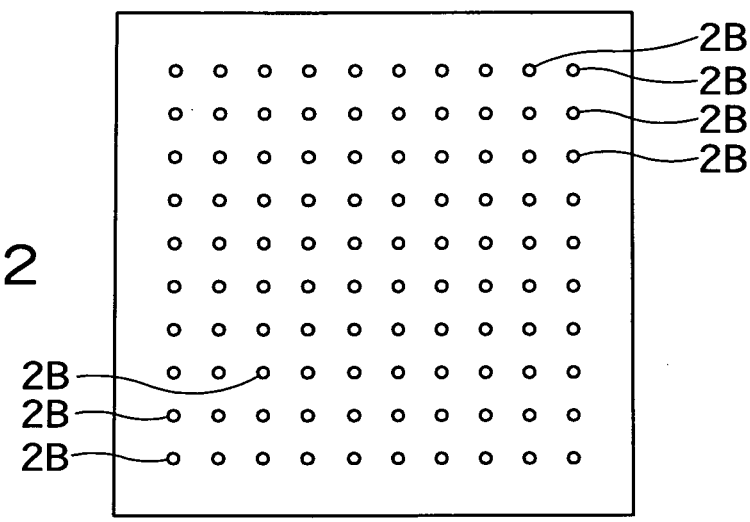
FIG. 2 is a plan view of a basic wiring layer (second layer) of the embodiment of the present invention before being subjected to design processing.
Figure 3:
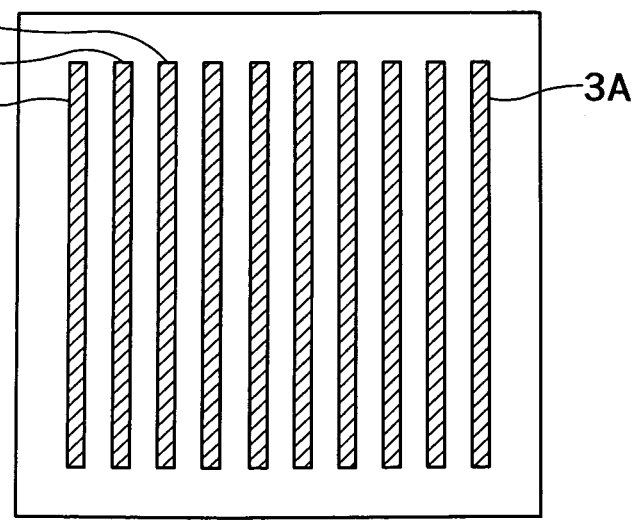
FIG. 3 is a plan view of a basic wiring layer (third layer) of the embodiment of the present invention before being subjected to design processing.
Figure 4:
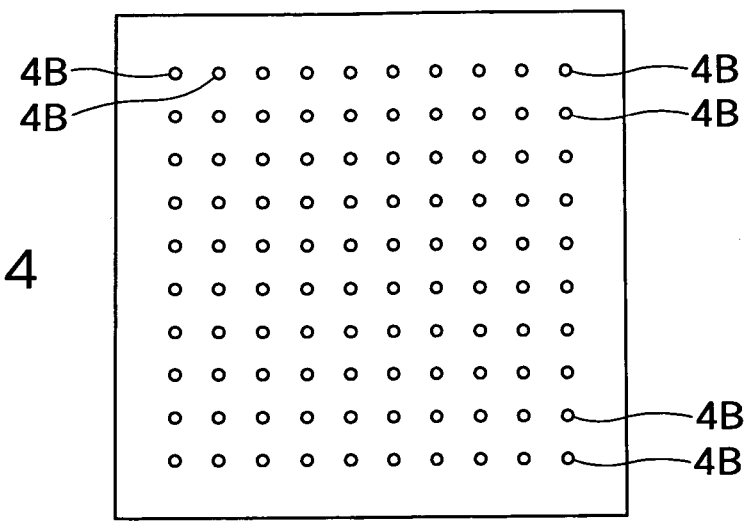
FIG. 4 is a plan view of a basic wiring layer (fourth layer) of the embodiment of the present invention before being subjected to design processing.
Figure 5:
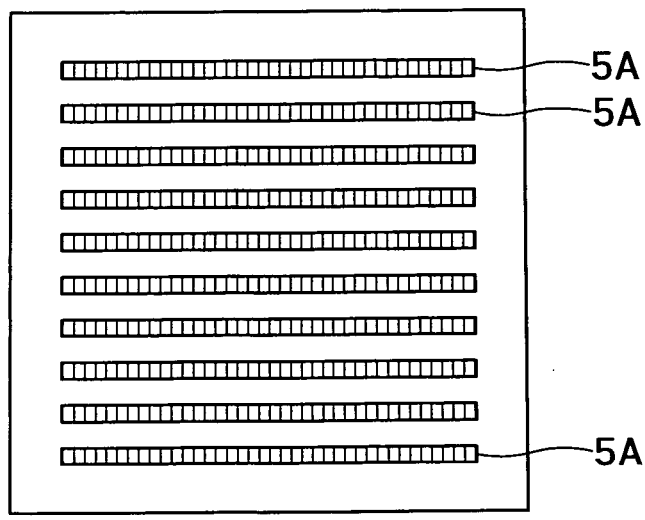
FIG. 5 is a plan view of a basic wiring layer (fifth layer) of the embodiment of the present invention before being subjected to design processing.
Figure 6:
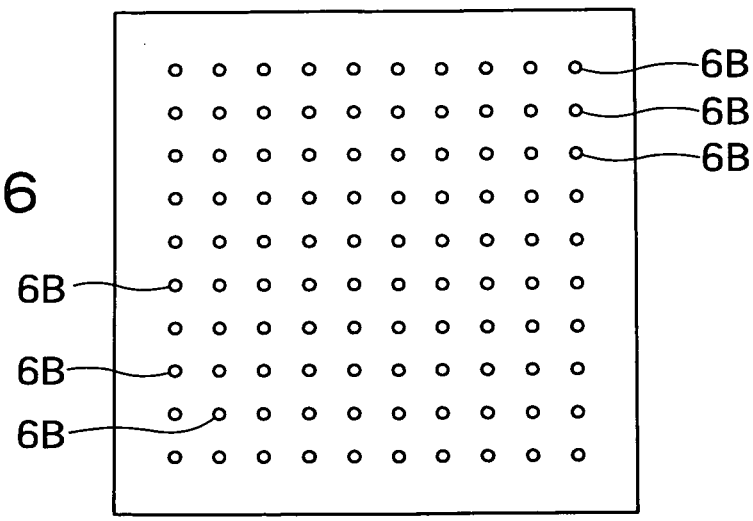
FIG. 6 is a plan view of a basic wiring layer (sixth layer) of the embodiment of the present invention before being subjected to design processing.
Figure 7:
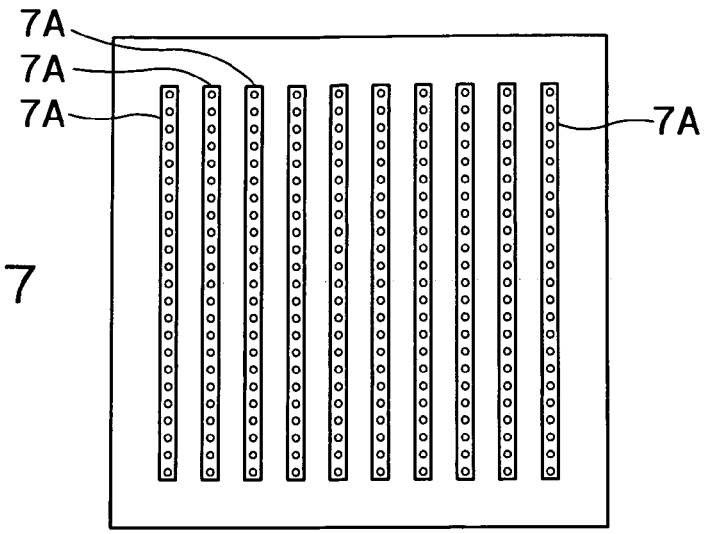
FIG. 7 is a plan view of a basic wiring layer (seventh layer) of the embodiment of the present invention before being subjected to design processing.
Figure 8:
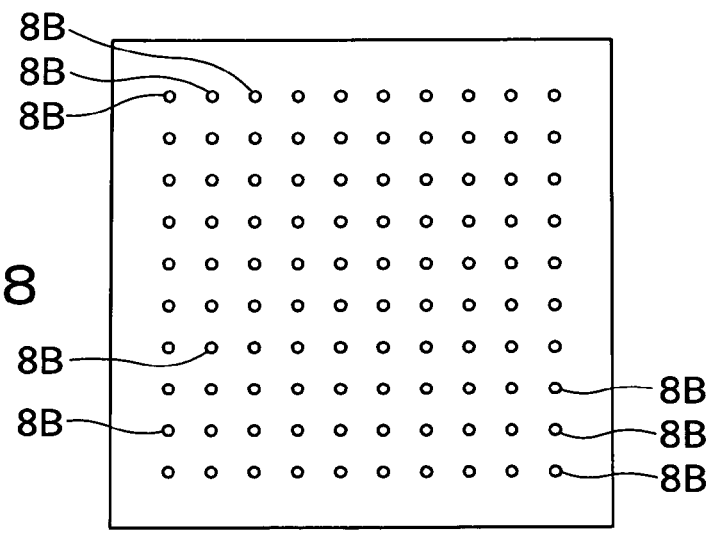
FIG. 8 is a plan view of a basic wiring layer (eighth layer) of the embodiment of the present invention before being subjected to design processing.
Figure 9:
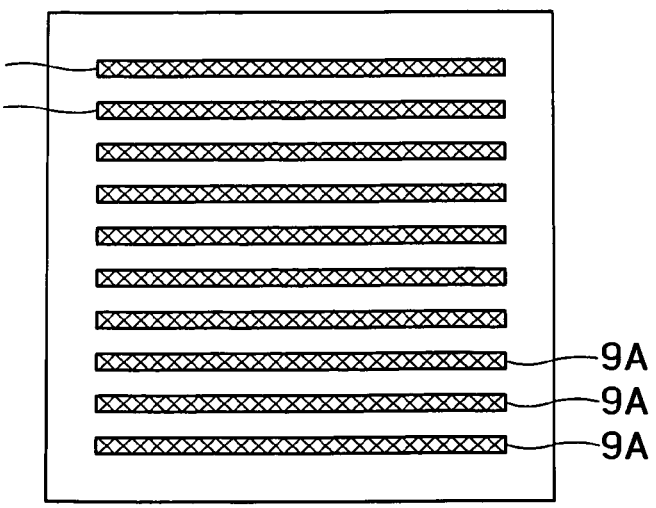
FIG. 9 is a plan view of a basic wiring layer (lowermost ninth layer) of the embodiment of the present invention before being subjected to design processing.

Similar explanations can be given for the basic wiring layers (basic via array layers) shown in FIGS. 2, 4, 6, and 8. These basic wiring layers do not include wiring traces but include vias 2B, 4B, 6B, and 8B regularly arranged to form arrays. These vias are for electrically connecting the wiring traces of their immediately upper and lower basic wiring layers. For example, viewed two-dimensionally, the vias 2B in FIG. 2 are located at the intersections of the wiring traces 1A of FIG. 1 and the wiring traces 3A of FIG. 3, so as to be capable of electrically connecting the upper wiring traces 1A and the lower wiring traces 3A at the intersections. Remaining after the design processing, the vias 2B electrically connect the upper wiring traces and the lower wiring traces at the intersections, and when removed (eliminated), of course the upper and lower wiring traces are not electrically connected at the intersections.

Figure 10:
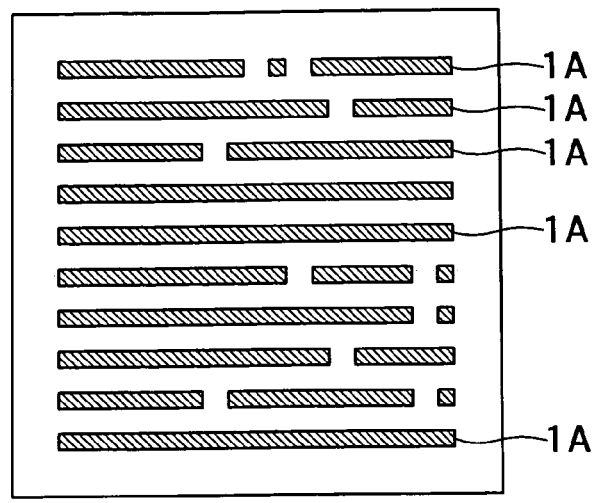
FIG. 10 shows a processed wiring layer after being subjected to design processing, and corresponds to the first layer shown in FIG. 1.
Figure 11:
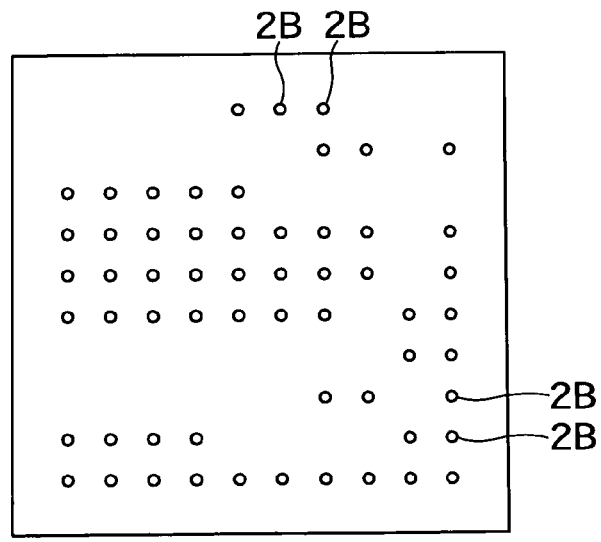
FIG. 11 shows a processed wiring layer after being subjected to design processing, and corresponds to the second layer shown in FIG. 2.
Figure 12:
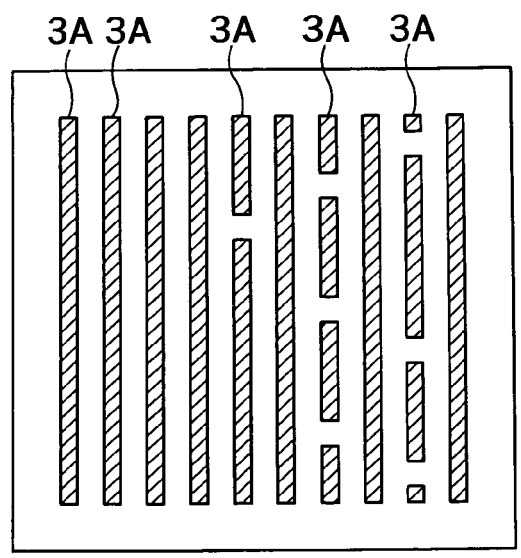
FIG. 12 shows a processed wiring layer after being subjected to design processing, and corresponds to the third layer shown in FIG. 3.

The aforementioned nine basic wiring layers are prepared as the base of the processed layers, based on which the wiring design is made. That is to say, after the signal paths are decided, predetermined portions of the wiring traces 1A, 3A, 5A, 7A, and 9A in FIGS. 1, 3, 5, 7, and 9 are cut (disconnected). In this way, as described later, the portions necessary for the wiring are selected, and the other portions serve as dummy wiring traces. That is to say, the wiring traces are cut to form wiring trace pieces. Simultaneously, the vias unnecessary for the signal wiring are removed (eliminated) from the vias 2B, 4B, 6B, and 8B of FIGS. 2, 4, 6, and 8. As described later, the remaining vias are divided into two groups, i.e., those necessary for the wiring (as relay portions), and those serving as dummy vias. Examples of the first to third layers are shown in FIGS. 10–12. In the first layer shown in FIG. 10, two portions in the central area of the uppermost wiring trace 1A in the drawing are cut. The fourth wiring trace 1A is not cut, and remains in the original state. The same applies to the third, fifth, seventh, and ninth layers. FIG. 12 shows the third layer, in which some portions are cut. Furthermore, as shown in FIG. 11, unnecessary vias 2B are removed, and necessary ones are left. That is to say, those necessary for the wiring (as relay portion) and those necessary as dummy vias are left to remain. The same applies to the fourth, sixth, and eighth layers. After being subjected to such a design process, the first to ninth basic wiring layers become the processed wiring layers. For example, FIG. 14 shows a section of these layers being stacked.

Figure 15:
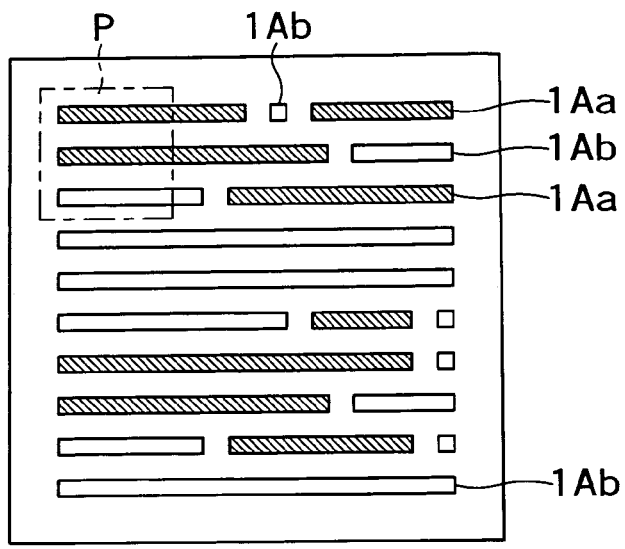
FIG. 15 is a drawing corresponding to FIG. 11, for explaining that there are wiring traces for passing signals, and wiring traces serving as dummies.
Figure 16:
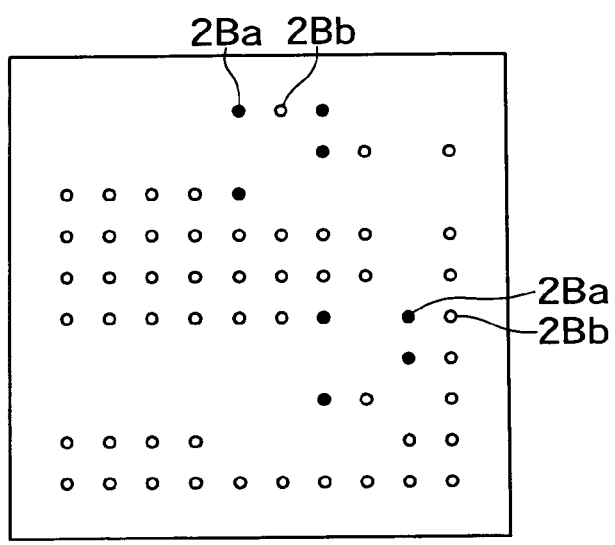
FIG. 16 is a drawing corresponding to FIG. 12, for explaining that there are wiring traces for passing signals, and wiring traces serving as dummies.
Figure 17:
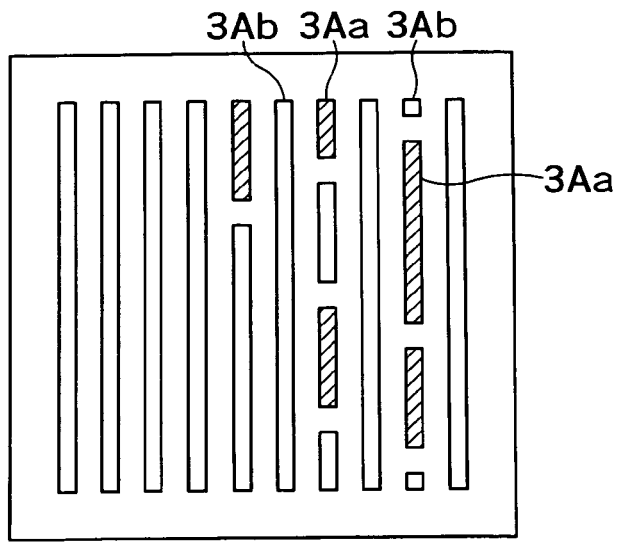
FIG. 17 is a drawing corresponding to FIG. 13, for explaining that there are wiring traces for passing signals, and wiring traces serving as dummies.
Figure 18:
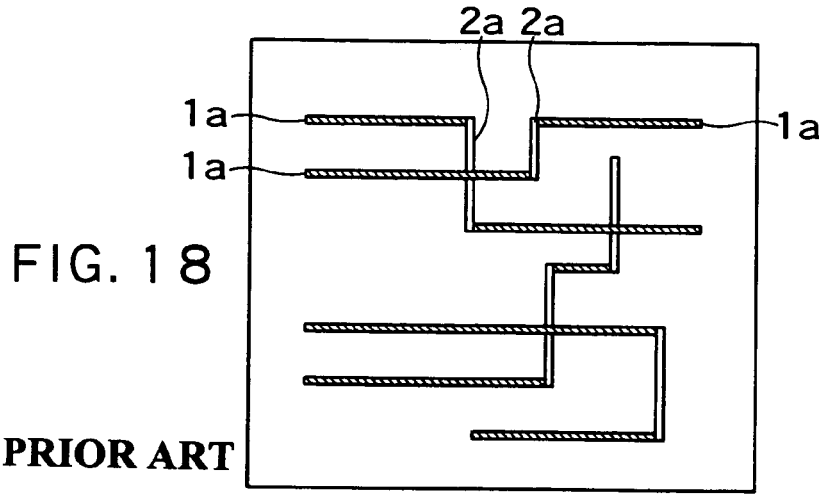
FIG. 18 shows the wiring of a conventional semiconductor integrated circuit, in which the wiring traces of an upper layer are connected to the wiring traces of a lower layer by the use of vias (not shown), thereby forming desired wiring.
Figure 19:
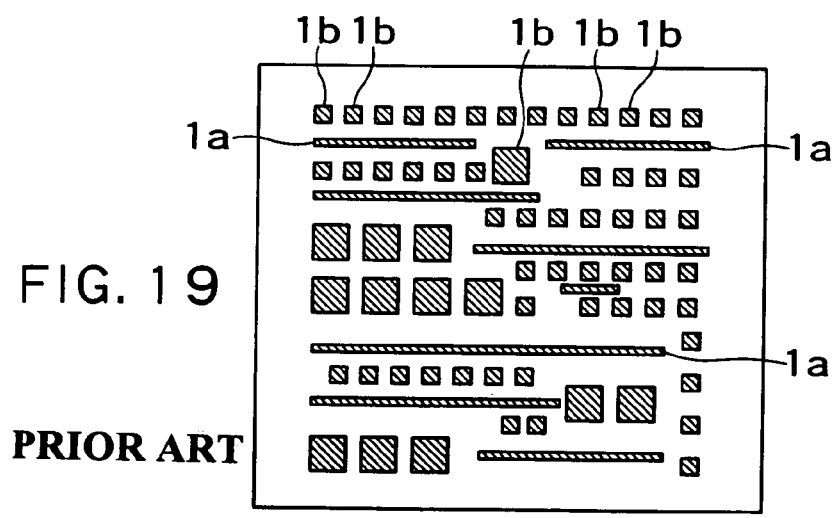
FIG. 19 is a plan view specifically showing the wiring traces and dummy wiring traces of the upper layer in FIG. 18.
Figure 20:
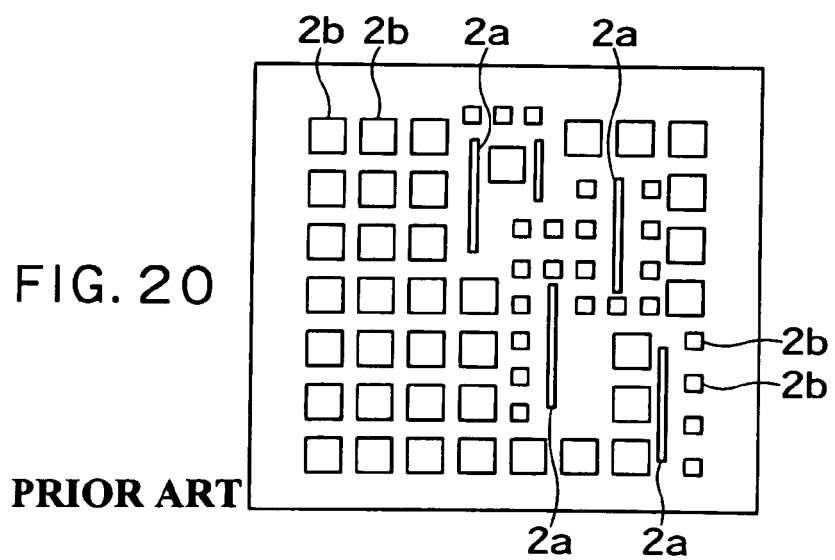
FIG. 20 is a plan view specifically showing the wiring traces and dummy wiring traces of the lower layer in FIG. 18.

Next, those portions necessary for the signal wiring and those serving as dummy portions will be described below. FIGS. 15–17 correspond to FIGS. 10–12 described before. In the wiring pattern of FIG. 15, the hatched wiring traces 1Aa are those used as the signal wiring traces. The hollow wiring traces 1Ab are those serving as dummy traces. The same applies to FIG. 17. The hatched wiring traces 3Aa are used as signal wiring traces, while the hollow wiring traces 3Ab serve as dummy traces. In FIG. 16, the black-dotted vias 2Ba are used to connect the upper and lower wiring traces, and the white-dotted vias 2Bb serve as dummy vias. What wiring traces and vias should remian can be freely decided from the viewpoint of wiring design. That is to say, in each wiring layer, the arrangement of remaining dummy wiring traces and vias can be decided depending on, e.g., the density and locations required for the ongoing process. In the basic wiring pattern layers as shown in FIGS. 15 and 17, the ratio of the signal wiring traces (1Aa) and the dummy wiring traces (1Ab) to the entire chip (coverage factor) can be determined based on the relationship with other steps in the manufacturing process. Furthermore, the coverage factor in a certain portion P of the basic wiring pattern layer as shown in FIG. 15 can be determined based on the relationship with the manufacturing process.

Thus, according to the embodiment of the present invention, the signal wiring can be formed with the portions necessary for signal wiring and the other portions being disconnected from each other by using regularly arranged wiring traces and vias. At the same time, it is possible to form redundant wiring traces and vias, which are indispensable in the miniaturization process, by following the design standard of the target layer and in a regular manner. As a result, it is possible to improve the controllability in the miniaturization process, and to improve the yield.

Figure 21:
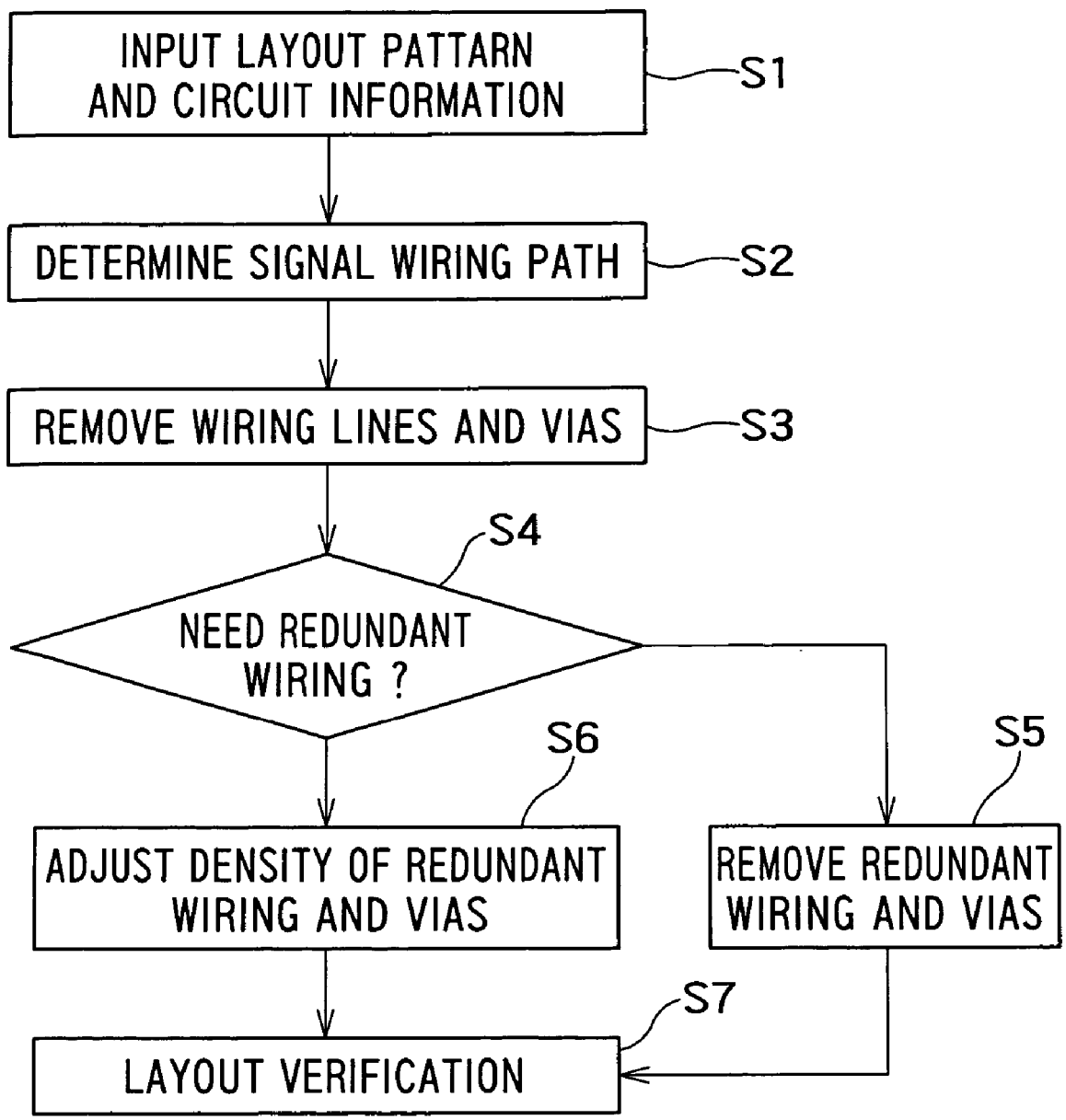
FIG. 21 is a flow chart of the steps of the embodiment of the present invention.

FIG. 21 is a flow chart showing the steps of the aforementioned embodiment.

First, the layout patterns and the circuit information are inputted (S1). That is to say, layout patterns of regularly arranged wiring traces and vias as shown in FIGS. 1–9 are prepared and inputted together with the circuit information. It is preferable that this step be automatically performed when the number of wiring layers and the layout area are determined.

Next, the signal paths are decided (S2). That is to say, the routing of the signal wiring traces is decided based on the circuit information and other limitation factors by the use of an automatic wiring tool, etc.

Then, unnecessary wiring traces and vias are removed (S3). That is to say, after the signal path is determined, unnecessary portions of the layout patterns are removed by the use of automatic wiring tool, etc.

Next, it is determined whether or not there is any portion (wiring traces and vias) that should be removed in each redundant layout pattern (S4). The portions determined to be unnecessary are removed (S5), and the portions determined to be necessary are adjusted so that the density per unit area becomes uniform (S6). Thereafter, a common layout pattern verification step is performed (S7).

The aforementioned embodiment is simply an example, and does not limit the scope of the present invention.

According to the embodiment of the present invention, wiring traces are formed in advance with regularity, and vias are formed in an array. When wiring is formed, some of the wiring traces and vias are used, and some of the wiring traces and vias not used for the actual wiring are left to remain so as to form a dummy pattern. Accordingly, it is possible to actually perform a manufacturing process with such a redundant layout pattern necessary for miniaturization process, thereby improving the controllability in the miniaturization process, and improving the yield.

As described above, according to the embodiment of the invention, it is possible to easily obtain a layout pattern having a uniformity and a regularity, which are indispensable in the miniaturization process, by using regularly arranged wiring traces and vias, instead of forming wiring in free wiring area, in such a manner that some portions are cut out from the wiring traces and vias, and that the remaining wiring traces are connected with each other through the remaining vias. According to the present invention, since it is possible to secure a predetermined wiring density, it is possible to improve the controllability during the processing steps, thereby improving the accuracy and yield.

With respect to the wiring traces, since the direction of the wiring traces are either vertical or horizontal (i.e., simple), it is possible to achieve a better resolution in consideration of the scanning characteristic with respect to the exposure or lithography of silicon. At this time a scanning condition (e.g., direction) can also be considered by changing the direction of the notch of the silicon wafer. Since it is possible to achieve a better resolution relatively easily because of the simple layout patterns, the reliability of the product with respect to the processing accuracy is also improved. Needless to say, this is more effective in lower layers, for which the design rules are stricter. Thus, the improvement in processing accuracy would result in that "a minuter design rule can be adopted." Furthermore, the improvement in processing accuracy would also result in that it is possible to define a design rule in the next generation more simply. Moreover, in the field of transfer method, which is highly dependent on layout pattern, since the layout patterns of the present invention are simple, resulting in that a wider area can be assigned to the layout pattern, it would be possible to decrease the time required for the transfer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A method of designing wiring of a semiconductor integrated circuit including as a wiring design base:

at least two of basic wiring pattern layers constituting a multilayer structure, each basic wiring pattern layer having a plurality of wiring traces in a strip shape;

a basic via array layer located between the two basic wiring pattern layers, having a plurality of vias relaying and connecting the wiring traces of the two basic wiring pattern layers; and another basic via array layer located at a side of one of the two basic wiring pattern layers, including a plurality of vias connecting predetermined ones of the wiring traces of the one of the two basic wiring pattern layers with circuit elements, the method comprising:

preparing the basic wiring pattern layers so as to have the wiring traces extending in a predetermined direction and arranged with regularity to form a repetitive pattern in wiring regions of the basic wiring pattern layers;

preparing the basic via array layer so as to have the vias arranged in an array form with regularity to form a repetitive pattern in a wiring region of the basic via array layer;

forming processed wiring pattern layers having been subjected to design processing from the basic wiring pattern layers by selecting predetermined wiring traces, and cutting the selected wiring traces at some intermediate portions to form a plurality of wiring trace pieces in consideration of a need for wiring traces serving as signal wiring traces, and a need for wiring traces serving as dummy wiring traces;

forming a processed via array layer having been subjected to design processing from the basic via array layer by eliminating unnecessary vias, with the vias serving as connections vias and dummy vias being left in consideration of a need for connection vias and dummy vias; and forming desired wiring lines by relaying and connecting the wiring traces and the wiring trace pieces of the two processed wiring pattern layers with remaining connection vias in the processed via array layer, and leaving the wiring traces, the wiring trace pieces, and the dummy vias not related to the wiring lines to form a dummy pattern.

2. The method of designing wiring of a semiconductor integrated circuit according to claim 1, wherein at a time of leaving the wiring traces and the wiring trace pieces not related to the wiring line to form a dummy pattern, the wiring traces and the wiring trace pieces to be left are selected in order to adjust a density of a whole of the processed wiring pattern layers by setting an amount of a pattern of dummy wiring traces in a predetermined manner.

3. The method of designing wiring of a semiconductor integrated circuit according to claim 2, wherein in the two basic wiring pattern layers of the multilayer structure sandwiching the basic via array layer, a direction of the wiring traces in one basic pattern layer intersects with a direction of the wiring traces in the other basic pattern layer in an orthogonal or inclined manner when viewed two-dimensionally, and the designing of wiring is performed based on such basic wiring pattern layers.

4. The method of designing wiring of a semiconductor integrated circuit according to claim 3, wherein in the basic via array layer, the vias are located at intersections of the wiring traces in one of the two basic pattern layers and those of the other of the two basic pattern layers intersecting in a skewed orthogonal or inclined manner when viewed two-dimensionally so as to connect the wiring traces, and the designing of wiring is performed based on such a via array layer.

5. The method of designing wiring of a semiconductor integrated circuit according to claim 1, wherein in the two basic wiring pattern layers of the multilayer structure sandwiching the basic via array layer, a direction of the wiring traces in one basic pattern layer intersects with a direction of the wiring traces in the other basic pattern layer in an orthogonal or inclined manner when viewed two-dimensionally, and the designing of wiring is performed based on such basic wiring pattern layers.

6. The method of designing wiring of a semiconductor integrated circuit according to claim 5, wherein in the basic via array layer, the vias are located at intersections of the wiring traces in one of the two basic pattern layers and those of the other of the two basic pattern layers intersecting in a skewed orthogonal or inclined manner when viewed two-dimensionally so as to connect the wiring traces, and the designing of wiring is performed based on such a via array layer.

7. A method of designing wiring of a semiconductor integrated circuit, comprising:
preparing as a base of wiring design at least two basic wiring pattern layers each including a plurality of wiring traces in a strip shape and a basic via array layer including a plurality of vias and being sandwiched between the basic wiring pattern layers;
forming processed wiring pattern layers having been subjected to design processing from the basic wiring pattern layers by cutting a predetermined number of the wiring traces at predetermined intermediate portions to form a plurality of wiring trace pieces from each wiring trace;
forming a processed via array layer having been subjected to design processing from the basic via array layer by eliminating unnecessary vias, the remaining vias serving as connection vias and dummy vias; and
forming a plurality of wiring lines by connecting part of the wiring traces and the wiring trace pieces of one of the two processed wiring pattern layers with that of another of the two processed wiring pattern layers using the connection vias of the processed via array layer, remaining wiring traces and wiring traces pieces being left as dummy wiring traces and dummy wiring trace pieces.

8. The method of designing wiring of a semiconductor integrated circuit according to claim 7, wherein when the processed wiring pattern layers are formed, numbers of the wiring traces and the wiring trace pieces to be left as the dummy wiring traces and the dummy wiring trace pieces are adjusted, thereby adjusting a density of entire patterns of the processed wiring pattern layers.

9. The method of designing wiring of a semiconductor integrated circuit according to claim 8, wherein the numbers of the wiring traces and the wiring trace pieces to be left as the dummy wiring traces and the dummy wiring trace pieces is adjusted by adjusting both a number of the wiring traces or the wiring trace pieces in an entire portion of each processed wiring pattern layer or processed via array layer, and the numbers of the wiring traces and the wiring trace pieces in a portion of the processed wiring pattern layer or processed via array layer, in relation to a manufacturing process.

10. The method of designing wiring of a semiconductor integrated circuit according to claim 7, wherein a direction of the wiring traces in one of the two basic pattern layers intersects with a direction of the wiring traces in other of the two basic pattern layers in an orthogonal or inclined manner when viewed two-dimensionally.

11. The method of designing wiring of a semiconductor integrated circuit according to claim 10, wherein the vias of the processed via array layer are located at intersections of the wiring traces to be connected in one of the two basic pattern layers and those of the other intersecting with each other in a skewed orthogonal or inclined manner when viewed two-dimensionally so as to connect the wiring traces and the wiring trace pieces of the two basic pattern layers.

12. The method of designing wiring of a semiconductor integrated circuit according to claim 7, wherein each of the basic wiring pattern layers includes the wiring traces in a strip shape which are parallel to each other, and a direction of the wiring traces in one of the two basic pattern layers intersects with a direction of the wiring traces in other of the two basic pattern layers in a skewed manner when viewed two-dimensionally.

13. The method of designing wiring of a semiconductor integrated circuit according to claim 12, wherein the wiring traces in a strip shape in one of the two basic wiring pattern layers are substantially orthogonal to those in other of the two basic pattern layers when viewed two-dimensionally.

14. The method of designing wiring of a semiconductor integrated circuit according to claim 12, wherein in the basic via array layer, the vias are arranged substantially in a matrix form.

15. The method of designing wiring of a semiconductor integrated circuit according to claim 14, wherein a plurality of the processed wiring pattern layers and a plurality of the processed via array layers are alternately stacked, and in every other processed wiring pattern layer, the direction in which the wiring traces extends is the same.

* * * * *

UNITED STATES PATENT AND TRADEMARK OFFICE
CERTIFICATE OF CORRECTION

PATENT NO. : 7,200,831 B2
APPLICATION NO. : 10/972463
DATED : April 3, 2007
INVENTOR(S) : Kitabayashi et al.

Page 1 of 1

It is certified that error appears in the above-identified patent and that said Letters Patent is hereby corrected as shown below:

On the title page, Item (75), the second Inventors Name has been omitted. Item (75) should read:
-- [75]   Inventor:   Shinji Kitabayashi, Tokyo        (JP)
                      Yukihiro Urakawa, Kanagawa    (JP)--

Signed and Sealed this

Twenty-ninth Day of May, 2007

JON W. DUDAS
*Director of the United States Patent and Trademark Office*